(12) United States Patent
Hayashi et al.

(10) Patent No.: US 10,103,708 B2
(45) Date of Patent: Oct. 16, 2018

(54) HEATING BODY, VIBRATION DEVICE, ELECTRONIC APPARATUS, AND MOVING OBJECT

(71) Applicant: SEIKO EPSON CORPORATION, Tokyo (JP)

(72) Inventors: Kenji Hayashi, Hino (JP); Akihiro Fukuzawa, Fujimi-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 710 days.

(21) Appl. No.: 14/575,249

(22) Filed: Dec. 18, 2014

(65) Prior Publication Data

US 2015/0180444 A1 Jun. 25, 2015

(30) Foreign Application Priority Data

Dec. 24, 2013 (JP) ................................. 2013-265769

(51) Int. Cl.
| | |
|---|---|
| *H01L 41/22* | (2013.01) |
| *H03H 9/08* | (2006.01) |
| *H05B 1/02* | (2006.01) |
| *H05B 3/14* | (2006.01) |
| *H03L 1/04* | (2006.01) |
| *H03H 9/05* | (2006.01) |
| *H03L 1/02* | (2006.01) |

(52) U.S. Cl.
CPC ............ *H03H 9/08* (2013.01); *H03H 9/0547* (2013.01); *H03L 1/028* (2013.01); *H03L 1/04* (2013.01); *H05B 1/023* (2013.01); *H05B 3/143* (2013.01); *H01L 2224/32145* (2013.01); *H01L 2224/73265* (2013.01); *H01L 2924/16195* (2013.01)

(58) Field of Classification Search
CPC . H01L 2224/73265; H01L 2224/32145; H01L 21/02488
See application file for complete search history.

(56) References Cited

U.S. PATENT DOCUMENTS

| | | | | |
|---|---|---|---|---|
| 3,500,143 A | * | 3/1970 | Lamming | ............... H01L 21/74 |
| | | | | 257/579 |
| 5,815,522 A | * | 9/1998 | Nagai | ..................... H01S 5/162 |
| | | | | 372/45.01 |
| 5,952,572 A | | 9/1999 | Yamashita et al. | |
| 7,649,423 B2 | | 1/2010 | Kasahara | |
| 2005/0285482 A1 | | 12/2005 | Oita et al. | |
| 2006/0290239 A1 | | 12/2006 | Kasahara et al. | |
| 2007/0268078 A1 | | 11/2007 | Lee | |

(Continued)

FOREIGN PATENT DOCUMENTS

| | | | |
|---|---|---|---|
| EP | 2 228 903 A1 | 9/2010 | |
| JP | 09-196682 * | 7/1997 | ................ G01P 9/04 |
| JP | H09-196682 A | 7/1997 | |

(Continued)

*Primary Examiner* — Thomas Dougherty
*Assistant Examiner* — Karen B Addison
(74) *Attorney, Agent, or Firm* — Oliff PLC

(57) ABSTRACT

An IC for heating includes a semiconductor, substrate on which a diffusion layer is formed; a first pad that applies a power source voltage to the diffusion layer; and a second pad that applies a ground voltage to the diffusion layer. A semiconductor substrate includes slits such that the slits intersect a virtual straight line connecting the pads when the semiconductor substrate is seen in a plan view.

20 Claims, 12 Drawing Sheets

(56) References Cited

U.S. PATENT DOCUMENTS

2015/0180203 A1* 6/2015 Kinugawa ............... H01S 5/162
372/45.01

FOREIGN PATENT DOCUMENTS

| JP | 11-041032 | 2/1999 |
| JP | 2000-196361 A | 7/2000 |
| JP | 2000-340344 A | 12/2000 |
| JP | 2002-314339 A | 10/2002 |
| JP | 2005-310494 A | 11/2005 |
| JP | 2006-014208 A | 1/2006 |
| JP | 2007-006270 A | 1/2007 |
| JP | 2007-312387 A | 11/2007 |
| JP | 2008-060716 A | 3/2008 |
| JP | 2010-213280 A | 9/2010 |

* cited by examiner

HEATING BODY, VIBRATION DEVICE, ELECTRONIC APPARATUS, AND MOVING OBJECT

BACKGROUND

1. Technical Field

The present invention relates to a heating body, a resonation device, an electronic apparatus, and a moving object, for example, an oven controlled quartz crystal oscillator.

2. Related Art

A quartz crystal oscillator used for reference frequency signal sources of communication equipment or a measuring instrument is required to have a stabilized output frequency with high precision with respect to a change in temperature. In general, an oven controlled quartz crystal oscillator (OCXO) is known as an oscillator capable of obtaining an extremely high frequency stability degree among quartz crystal oscillators. The OCXO is an oscillator that accommodates a quartz crystal resonator in a thermostatic oven whose temperature is controlled to be constant, and JP-A-2008-60716 discloses a quartz crystal oscillator in which a quartz crystal resonator and a heating body sealed in a package are arranged and which includes a substrate provided with a member with high heat conductivity in the vicinity of the quartz crystal resonator for heating the whole quartz crystal resonator using the heating body as an OCXO in the related art. Further, JP-A-2010-213280 discloses an OCXO in which a quartz crystal resonator element is arranged on an integrated circuit including a heating body and which is arranged in a package together with another circuit element.

However, in the quartz crystal oscillator disclosed in JP-A-2008-60716, since the whole quartz crystal resonator sealed in the package needs to be heated for stabilizing the frequency of the oscillator, there is a problem in that power consumed by the heating body is increased because an area heated by the heating body needs to be wide. Further, in the OCXO disclosed in JP-A-2010-213280, a configuration in which a quartz crystal resonator element is arranged on an integrated circuit including a heating body is described, but there is a problem in that the quartz crystal resonator element may not be efficiently heated depending on the configuration of the heating body or a positional relationship between the heating body and the quartz crystal resonator element.

SUMMARY

An advantage of some aspects of the invention is to provide a heating body capable of efficiently heating a desired area, a resonation device capable of efficiently heating a resonator element, and an electronic apparatus and a moving object using the heating body or the vibration device.

An aspect of the invention can be implemented as the following forms or application examples.

APPLICATION EXAMPLE 1

A heating body according to this application example includes: a heating unit that is formed in a semiconductor substrate and includes a first area and a second area; and a third area that is formed on the semiconductor substrate, in which the heating unit performs heating by applying a potential difference between the first area and the second area, and the third area is arranged so as to intersect a virtual straight line connecting the first area and the second area and is an area whose heating amount is smaller than those of the first area and the second area when the semiconductor substrate is seen in a plan view.

In the heating body according to this application example, the heating amount of the third area is smaller than those of the first area and the second area because the current flowing between the first area and the second area bypasses the third area so as not to flow into the third area or the amount of the current flowing into the third area is smaller than that of the current flowing between the first area and the second area. That is, the current flowing between the first area and the second area can efficiently heat the first area and the second area because the current does not heat the third area or the heating amount thereof is small even though the third area is heated. Therefore, the current flowing between the first area and the second area can efficiently heat a desired area of the semiconductor substrate and the heating amount of an area which does not need to be heated is small. As a result, the current flowing into the heating body can be reduced.

APPLICATION EXAMPLE 2

In the heating body according to the application example described above, the third area may be an area with resistivities higher than those of the first area and the second area.

In the heating body according to this application example, it is possible for the current to flow between the first area and the second area so as to bypass the third area whose resistivity is higher than those of the first area and the second area.

APPLICATION EXAMPLE 3

A heating body according to this application example includes: a semiconductor substrate on which a diffusion resistance layer is formed; a first electrode that applies a first voltage to the diffusion resistance layer; and a second electrode that applies a second voltage to the diffusion resistance layer, in which an area with resistivity higher than that of the diffusion resistance layer is arranged so as to intersect a virtual straight line connecting the first electrode and the second electrode when the semiconductor substrate is seen in a plan view.

In the heating body according to this application example, the current flowing between the first electrode and the second electrode bypasses an area whose resistivity is higher than that of the diffusion resistance layer. Therefore, since the current flowing between the first electrode and the second electrode flows into a path longer than the straight line connecting the first electrode and the second electrode in the diffusion resistance layer formed on the semiconductor substrate, a desired area can be efficiently heated when the semiconductor substrate is seen in a plan view and an area that does not need to be heated is not heated. As a result, the current flowing into the heating body can be reduced.

APPLICATION EXAMPLE 4

In the heating body according to the application example described above, the area with high resistivity may be an area on which the diffusion resistance layer is not formed.

In the heating body according to this application example, since the current does not flow into an area on which the diffusion resistance layer is not formed or the amount of the current flowing into the area on which the diffusion resistance layer is not formed is smaller than that of the current flowing into the diffusion resistance layer, it is possible for the current to flow between the first electrode and the second electrode so as to bypass the area on which the diffusion resistance layer is not formed.

APPLICATION EXAMPLE 5

In the heating body according to the application example described above, the area with high resistance may be an area on which a transistor is formed.

In the heating body according to this application example, since the current does not flow into an area on which a transistor is formed by turning OFF the transistor or the amount of the current flowing into the area on which the transistor is formed is smaller than that of the current flowing into the diffusion resistance layer, it is possible for the current to flow between the first electrode and the second electrode so as to bypass the area on which the transistor is formed.

APPLICATION EXAMPLE 6

In the heating body according to the application example described above, the first electrode and the second electrode may be arranged in a same side area along an outer peripheral edge of the semiconductor substrate.

In the heating body according to this application example, it is possible to restrict the peripheral area of the first electrode and the second electrode which is an area whose temperature is relatively low when the semiconductor substrate is seen in a plan view due to radiation of heat through the wiring that is connected to an external electrode to the same side area close to a predetermined side. Therefore, according to the heating body of the application example, the area of the surface of the semiconductor substrate with a low temperature can be restricted to one portion and a decrease in heating efficiency of a desired area due to radiation of heat can be prevented.

APPLICATION EXAMPLE 7

In the heating body according to the application example described above, the diffusion resistance layer may be formed of a layer obtained by allowing impurities to be doped on a surface of the semiconductor substrate.

In the heating body according to this application example, the diffusion resistance layer can be easily formed to have a desired shape on the semiconductor substrate.

APPLICATION EXAMPLE 8

In the heating body according to the application example described above, the diffusion resistance layer may be formed of a layer obtained by allowing impurities to be doped on a surface of the semiconductor substrate and a conductive layer.

In the heating body according to this application example, since the diffusion resistance layer has relatively low resistivity, it is possible to prevent the diffusion resistance layer from being excessively heated. Further, it is possible to increase the degree of freedom of design by adjusting the resistivity of the diffusion resistance layer to have a desired value.

APPLICATION EXAMPLE 9

In the heating body in the application example described above, the heating body may further include an insulator layer on the diffusion resistance layer, and a first pad that is electrically connected to the first electrode and a second pad that is electrically connected to the second electrode may be formed on a surface of the insulation layer.

In the heating body according to this application example, it becomes unnecessary for the first electrode and the second electrode to be directly connected to the external electrode through a wiring by providing the first pad and the second pad, so that the degree of freedom of a wiring method to the outside is increased.

APPLICATION EXAMPLE 10

In the heating body according to the application example described above, the first pad may overlap with the first electrode in a plan view, and the second pad may overlap with the second electrode in a plan view.

APPLICATION EXAMPLE 11

A vibration device according to this application example includes: the heating body according any one of Application Examples described above; and a resonator element, in which the resonator element is arranged on the surface of the heating body.

The vibration device is, for example, one of various kinds of oscillators or a sensor.

In the vibrating device according to this application example, since the heating body whose desired area is heated when the semiconductor substrate is seen in a plan view is used, it is possible to efficiently heat a resonator element by arranging the resonator element in the desired area of the heating body. Therefore, according to the application example, it is possible to reduce power consumption of the heating body and to realize a vibration device with low power consumption.

APPLICATION EXAMPLE 12

In the vibration device according to the application example described above, the heating body may include a thermosensitive element that is formed on the semiconductor substrate, and the thermosensitive element may overlap with the resonator element in a plan view.

In the vibrating device according to this application example, since the temperature of the resonator element can be accurately detected, it is possible to realize a vibration device with higher reliability.

APPLICATION EXAMPLE 13

An electronic apparatus according to this application example includes: the heating body according to any one of the application examples described above or the vibration device according to any one of the application examples described above.

APPLICATION EXAMPLE 14

A moving object according to this application example includes: the heating body according to anyone of the application examples described above or the vibration device according to any one of the application examples described above.

In the electronic apparatus and the moving object according to the application examples, since the heating body capable of allowing a desired area to be efficiently heated or the vibration device including the resonator element efficiently heated using the heating body is included, it is possible to realize an electronic apparatus and a moving object with reduced power consumption.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail with reference to the accompanying figures. Further, the embodiments described below do not inappropriately restrict the contents of the invention described in aspects of the invention. Furthermore, all of the configurations described below are not necessarily essential constituent elements of the invention.

In addition, hereinafter, a vibration device according to the invention will be described with reference to an oven controlled quartz crystal oscillator (OCXO), but the vibration device according to the invention may be another kind of device (for example, an oscillator or a sensor other than the OCXO) including a heating body and a resonator element.

1. Oven Controlled Quartz Crystal Oscillator (OCXO)

1-1. First Embodiment

Figure 1:
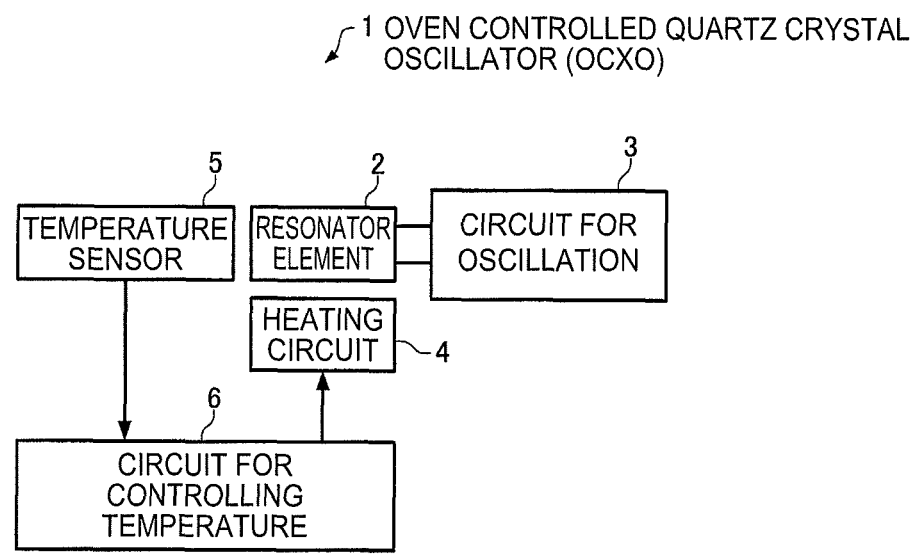
FIG. 1 is a functional block diagram of an oven controlled quartz crystal oscillator (OCXO) according to the present embodiment.

FIG. 1 is a functional block diagram of an oven controlled quartz crystal oscillator (OCXO) which is an example of a vibration device according to the present embodiment. As illustrated in FIG. 1, the oven controlled quartz crystal oscillator (OCXO) 1 of the present embodiment includes a resonator element 2, a circuit 3 for oscillation, a heating circuit 4, a temperature sensor 5, and a circuit 6 for controlling the temperature. Further, some of these elements of the oven controlled quartz crystal oscillator (OCXO) 1 of the present embodiment may be omitted or changed, and alternatively other elements may be added to the OCXO 1.

In the present embodiment, the resonator element 2 is a resonator element (quartz crystal resonator) using a quartz crystal as a substrate material, and, for example, a quartz crystal resonator of an AT cut or an SC cut is used for the resonator element 2. However, the resonator element 2 may be a surface acoustic wave (SAW) resonator or a micro electro mechanical systems (MEMS) resonator. Further, as a substrate material of the resonator element 2, a piezoelectric single crystal such as lithium tantalate or lithium niobate; a piezoelectric material of piezoelectric ceramics or the like such as zirconate titanate; or a silicon semiconductor material can be used in addition to a quartz crystal. Moreover, as an excitation unit of the resonator element 2, an element resulted from a piezoelectric effect may be used or electrostatic driving may be performed using the Coulomb's force. In addition, as the resonator element 2, an element that detects a physical amount such as an inertial sensor (an acceleration sensor, a gyro sensor, or the like) or a force sensor (inclination sensor or the like) may be used.

The circuit 3 for oscillation is a circuit that is connected to both ends of the resonator element 2 and oscillates the resonator element 2 by amplifying a signal output from the resonator element to be fed back to the resonator element 2.

A circuit configured of the resonator element 2 and the circuit 3 for oscillation may be any of various oscillation circuits such as a pierce oscillation circuit, an inverter type oscillation circuit, a colpitts oscillation circuit, or a hartley oscillation circuit.

The heating circuit 4 is a circuit heating by the current flowing into a resistor. In the present embodiment, the heating circuit 4 is arranged in the vicinity of the resonator element 2 for heating the resonator element 2.

The temperature sensor 5 is disposed in the vicinity of the resonator element 2 and outputs a signal (for example, a signal having a voltage in response to the temperature) in response to the temperature.

The circuit 6 for controlling the temperature is a circuit that controls the amount of the current flowing into the resistor of the heating circuit 4 based on an output signal (temperature information) of the temperature sensor 5 and maintains the temperature of the resonator element 2 to be constant. For example, the circuit 6 for controlling the temperature allows a desired current to flow into the resistor of the heating circuit 4 in a case where the current temperature to be determined from the output signal of the temperature sensor 5 is lower than the set reference temperature, and controls the current not to flow into the resistor of the heating circuit 4 in a case where the current temperature is higher than the reference temperature. In addition, for example, the circuit 6 for controlling the temperature may control the amount of the current flowing into the resistor of the heating circuit 4 to be increased or decreased according to a difference between the current temperature and the reference temperature.

Figure 2:
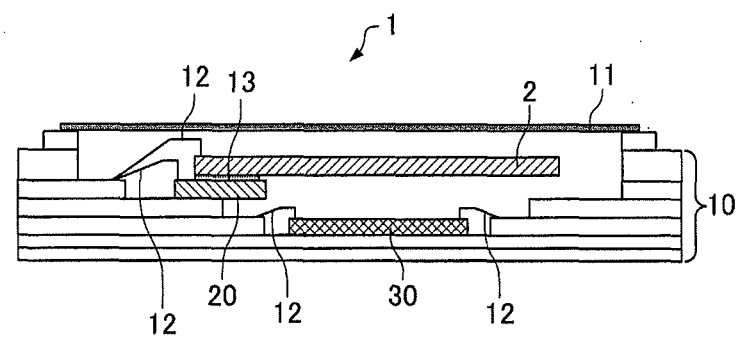
FIG. 2 is a cross-sectional view illustrating a structure of the oven controlled quartz crystal oscillator (OCXO) according to the present embodiment.

FIG. 2 is a cross-sectional view illustrating the structure of the oven controlled quartz crystal oscillator (OCXO) 1 according to the present embodiment. As illustrated in FIG. 2, the oven controlled quartz crystal oscillator (OCXO) 1 according to the present embodiment includes the resonator element 2, a package 10, a lid 11, an IC 20 for heating, and an IC 30 for oscillation.

The package 10 is a stacked package such as a ceramic package or the like and accommodates the resonator element 2, the IC 20 for heating, and the IC 30 for oscillation in the same space. Specifically, an opening portion is provided on an upper portion of the package 10, and an accommodation chamber is formed by covering the opening portion with the lid 11 and accommodates the resonator element 2, the IC 20 for heating, and the IC 30 for oscillation.

In the IC 30 for oscillation, a lower surface is bonded and fixed to the upper surface of the second layer from the lower side of the package 10, and respective electrodes (pads) provided on the upper surface of the IC 30 for oscillation and respective electrodes provided on the upper surface of the third layer from the lower side of the package 10 are bonded to each other through a wire 12. In the present embodiment, the IC for oscillation includes the circuit 3 for oscillation and the circuit 6 for controlling the temperature illustrated in FIG. 1.

In the IC 20 for heating (an example of the heating body), a portion of the lower surface is bonded and fixed to the upper surface of the fourth layer from the lower side of the package 10, and respective electrodes (pads) provided on the upper surface of the IC 20 for heating and respective electrodes provided on the upper surface of the fifth layer from the lower side of the package 10 are bonded to each other through the wire 12. In the present embodiment, the IC for heating includes the heating circuit 4 and the temperature sensor 5 illustrated in FIG. 1.

In the resonator element 2, an electrode provided in a portion of the lower surface is bonded and fixed to an electrode (pad) provided on the upper surface of the IC 20 for heating through a conductive member 13, and an electrode (pad) provided on the upper surface of the resonator element 2 and an electrode provided on the upper surface of the fifth layer from the lower side of the package 10 are bonded to each other through the wire 12.

Moreover, a wiring (not illustrated) for electrically connecting an electrode which is wire-bonded to an electrode on the upper surface of the resonator element 2, respective electrodes which are wire-bonded to respective electrodes of the IC 20 for heating, and respective electrodes which are wire-bonded to respective electrodes of the IC 30 for oscillation to one another is provided in the inside of the package 10 or on the surface thereof.

Further, a power source terminal (not illustrated), a ground terminal, or another external terminal (output terminal or the like of an oscillation signal) is provided on the lower surface of the package 10, a wiring for electrically connecting the power source terminal and the ground terminal, and the IC 20 for heating and the IC 30 for oscillation; and a wiring for electrically connecting another external terminal and the IC 30 for oscillation are provided in the inside of the package 10 or on the surface thereof.

Figure 3A:
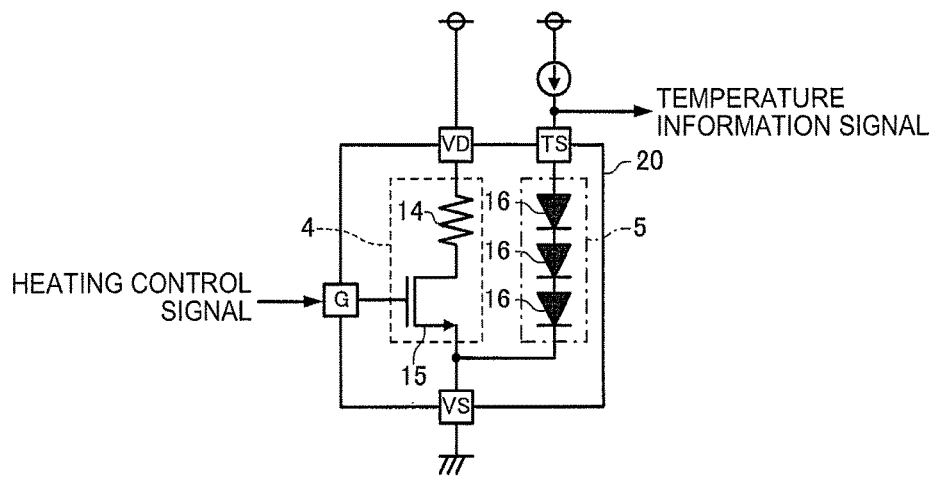
FIGS. 3A and 3B are views illustrating examples of a circuit configuration of an IC for heating.

FIG. 3A is a view illustrating an example of a circuit configuration of the IC 20 for heating illustrated in FIG. 2. As illustrated in FIG. 3A, the IC 20 for heating includes a power source terminal VD, a ground terminal VS, an input terminal G of a heating control signal, and an output terminal TS of a temperature information signal and is configured of the heating circuit 4 and the temperature sensor 5.

The heating circuit 4 has a configuration in which a resistor 14 and MOS transistors 15 are connected in series between the power source terminal and the ground terminal, and a heating control signal output from the circuit 6 for controlling the temperature illustrated in FIG. 1 is input to a gate of the MOS transistors 15 through the input terminal G. The current flowing into the resistor 14 is controlled by the heating control signal and thus, the heating amount of the resistor 14 is controlled.

The temperature sensor 5 is configured such that one or a plurality of diodes 16 are connected to one another in series between the output terminal TS and the ground terminal in a forward direction. A constant current is supplied to the output terminal TS from a constant current source provided in the circuit 6 for controlling the temperature illustrated in FIG. 1 and the constant current flows in the diode 16 in the forward direction in this manner. When the constant current flows in the diode 16 in the forward direction, since the voltage of both ends of the diode 16 is substantially linearly changed with respect to a change in temperature (for example, the voltage is changed with a rate of approximately $-6$ mV/° C.), the voltage of the output terminal TS becomes a linear voltage with respect to the temperature. Consequently, a signal output from the output terminal TS can be used as a temperature information signal.

Figure 3B:
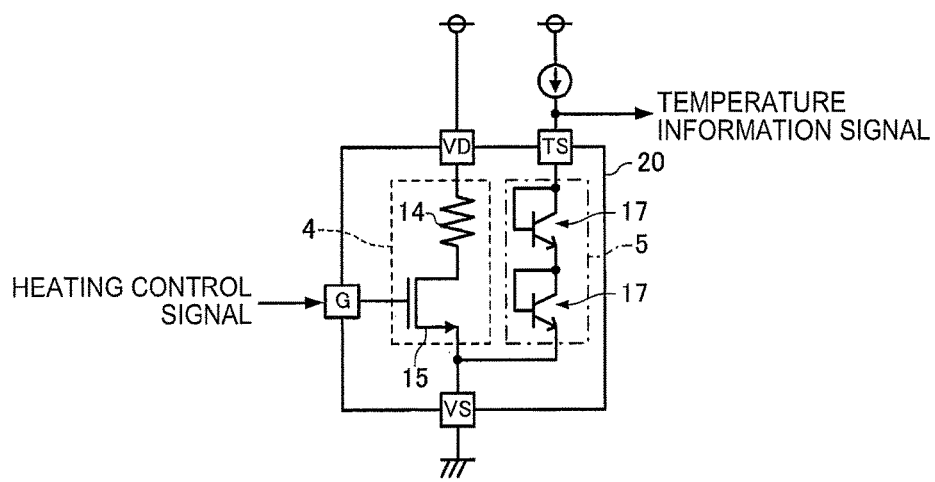

Further, FIG. 3B is a view illustrating another example of the circuit configuration of the IC 20 for heating illustrated in FIG. 2. In FIG. 3B, one or a plurality of bipolar transistors 17 in place of the diode 16 are connected in series between the output terminal TS and the ground terminal with respect to the circuit of FIG. 3A. A base and a collector are connected to each of the bipolar transistors 17, and the voltage between the base and the emitter is substantially linearly changed with respect to a change in temperature when a constant current is allowed to flow between the collector and the emitter of the bipolar transistor 17 in the forward direction, and thus, the voltage of the output terminal TS becomes a linear voltage with respect to the temperature. Therefore, the signal output from the output terminal TS can be used as the temperature information signal.

Figure 4:
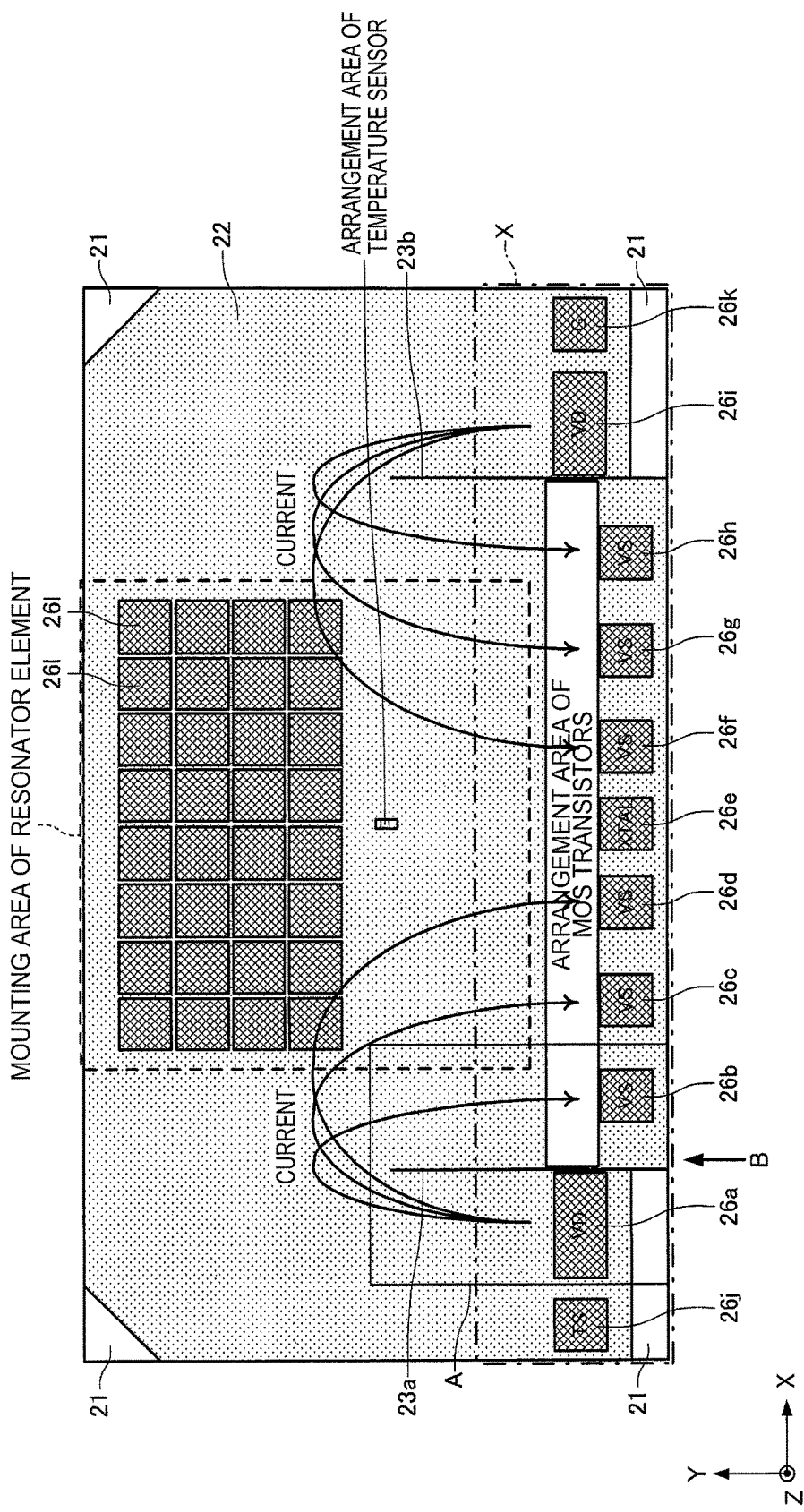
FIG. 4 is a view schematically illustrating a layout pattern of an IC for heating in the oven controlled quartz crystal oscillator (OCXO) according to a first embodiment.
Figure 5:
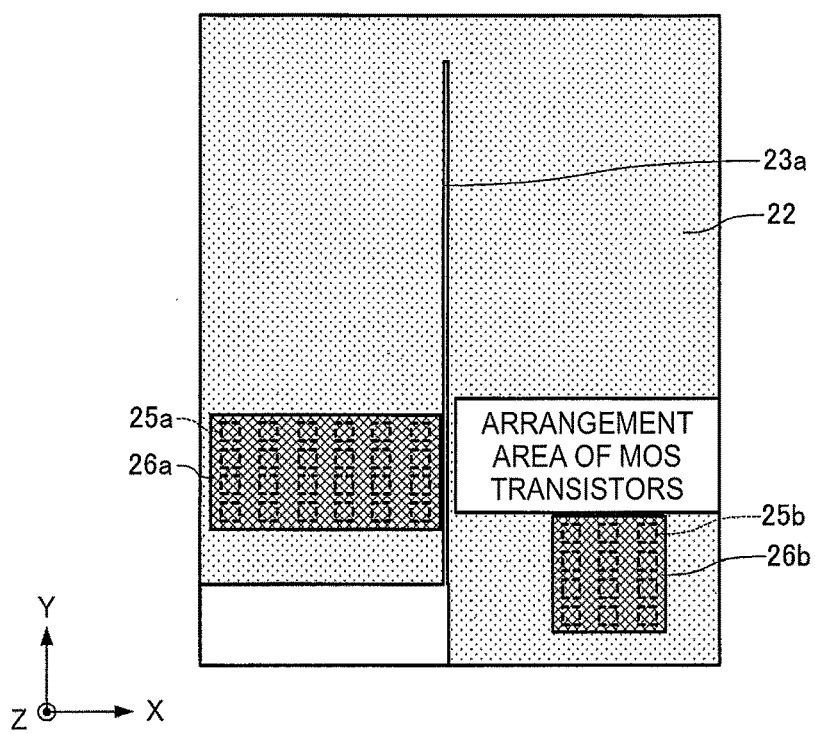
FIG. 5 is an enlarged view of a rectangular area A of FIG. 4.
Figure 6:
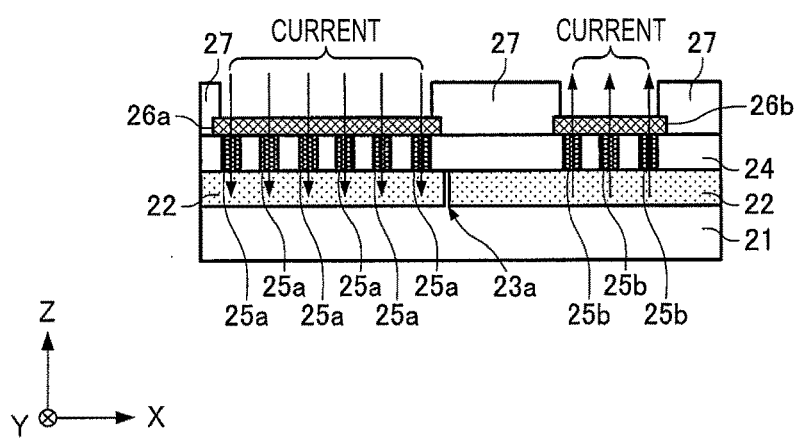
FIG. 6 is a side view of the rectangular area A of FIG. 4 when seen from a direction of an arrow B.

FIG. 4 is a view schematically illustrating the layout pattern of the IC 20 for heating illustrated in FIGS. 2 to 3B. Further, FIG. 5 is an enlarged view of the rectangular area A of FIG. 4 and FIG. 6 is a side view of the rectangular area A of FIG. 4 when seen from the direction of an arrow B. Further, FIG. 4 illustrates only some of the layers. In FIG. 6, illustration of MOS transistors arranged in an arrangement area of the MOS transistors of FIG. 4 is omitted.

As illustrated in FIGS. 4 to 6, a diffusion layer in which impurities are doped on the surface of a semiconductor substrate (wafer substrate) 21 is formed in the IC 20 for heating. In the present embodiment, the semiconductor substrate 21 is a P type semiconductor substrate to be formed by impurities such as boron (B) being mixed into a silicon substrate, and the diffusion layer 22 is an N type diffusion layer to be formed by impurities such as phosphorous (P)

being doped on the surface of the P type semiconductor substrate 21. The diffusion layer 22 (an example of a diffusion resistance layer) functions as a resistor 14 illustrated in FIGS. 3A and 3B. However, the semiconductor substrate 21 may be an N type semiconductor substrate to be formed by impurities such as phosphorous (P) being mixed to the silicon substrate and the diffusion layer 22 may be a P type diffusion layer to be formed by impurities such as boron (B) being doped on the surface of the N type semiconductor substrate 21. In addition, since the diffusion layer 22 can be formed by doping impurities on the semiconductor substrate 21 using an ion injection method or the like after a pattern in which only an area to be intended for doping impurities is opened using polysilicon or a photoresist is formed on the semiconductor substrate 21, the diffusion layer 22 can be easily formed to have a desired shape.

An insulation layer 24 is formed on the diffusion layer 22. For example, an insulation film using silicon dioxide ($SiO_2$) as a material can be used as the insulation layer 24.

A surface protective film 27 of an insulator is formed on the insulation layer 24. For example, a protective film using silicon dioxide ($SiO_2$) or polyimide as a material can be used as the surface protective film 27.

An opening portion (pad opening portion) is formed on a portion of the surface protective film 27, and rectangular pads 26*a* to 26*l* are formed on the surface of the insulation layer 24 in the opening portion.

The pad 26*a* is a pad functioning as the power source terminal VD illustrated in FIGS. 3A and 3B, and the pad 26*a* is electrically connected to the diffusion layer 22 through a plurality of vias 25*a* formed in the opening portion of the insulation layer 24. The pad 26*a* functions as an electrode (an example of a first electrode) for application of a power source voltage (an example of a first voltage) to the diffusion layer 22. In the same manner, the pad 26*i* is a pad functioning as the power source terminal VD and is electrically connected to the diffusion layer 22 through the plurality of vias (not illustrated) formed in the opening portion of the insulation layer 24. The pad 26*i* functions as an electrode (an example of the first electrode) for application of the power source voltage (an example of the first voltage) to the diffusion layer 22.

The pad 26*b* is a pad functioning as the ground terminal VS illustrated in FIGS. 3A and 3B, and is electrically connected to the diffusion layer 22 through the plurality of vias 25*b* formed in the opening portion of the insulation layer 24. The pad 26*b* functions as an electrode (an example of a second electrode) for application of the ground voltage (an example of the second voltage) to the diffusion layer 22. In the same manner, the pads 26*c*, 26*d*, 26*f*, 26*g*, and 26*h* are pads functioning as the ground terminal VS and are electrically connected to the diffusion layer 22 respectively through the vias (not illustrated) formed in the opening portion of the insulation layer 24. The pads 26*b*, 26*c*, 26*d*, 26*f*, 26*g*, and 26*h* function as an electrode (an example of a second electrode) for application of the ground voltage (an example of the second voltage) to the diffusion layer 22.

The pads 26*j* and 26*k* respectively are pads functioning as the output terminal TS and the input terminal G illustrated in FIGS. 3A and 3B.

Thirty two pads 26*l* arranged in a manner of 4 pads in each vertical row and 8 pads in each horizontal row are pads which are electrically connected to lower surface electrodes provided on the lower surface of the resonator element 2 and are formed so as to overlap with an area which is indicated by a dashed line in FIG. 4 and on which the resonator element 2 is mounted when the IC 20 for heating is seen in a plan view (a plan view when seen from the positive side to the negative side of the Z axis).

The pad 26*e* is electrically connected to thirty two pads 26*l* using a wiring pattern (not illustrated) and the pad 26*e* and the lower surface electrode of the resonator element 2 are electrically connected to each other when the resonator element 2 is bonded and fixed to the pad 26*l*.

The pads 26*a* to 26*l* are, for example, aluminum or alloys containing aluminum as a main component. The pads 26*a* to 26*k* are connected to respective electrodes provided in the package 10 through wire bonding and the pad 26*l* is connected to the lower surface electrode of the resonator element 2 through the conductive member 13.

Moreover, in the present embodiment, MOS transistors 15 are arranged in the vicinity area in a positive direction of a Y axis with respect to the pads 26*b*, 26*c*, 26*d*, 26*e*, 26*f*, 26*g*, and 26*h* in a plan view of the IC 20 for heating.

Moreover, in the present embodiment, the temperature sensor 5 is arranged in a position overlapping with the area on which the resonator element 2 is mounted in a plan view of the IC 20 for heating. That is, in the oven controlled quartz crystal oscillator (OCXO) 1 of the present embodiment, the temperature sensor 5 (an example of the thermosensitive element) overlaps with the resonator element 2 in a plan view of the IC for heating and the temperature sensor 5 is arranged in a position extremely close to the resonator element 2. Therefore, the temperature sensor 5 can detect the temperature of the resonator element 2 with high precision.

In addition, in the present embodiment, a slit 23*a* is formed on the surface of the semiconductor substrate 21 so as to intersect a virtual straight line (straight line connecting the gravity center of the pad 26*a* and the gravity center of the pad 26*b*) connecting the pad 26*a* and the pad 26*b* in a plan view of the IC for heating. Further, a slit 23*b* is formed so as to intersect a virtual straight line (straight line connecting the gravity center of the pad 26*i* and the gravity center of the pad 26*h*) connecting the pad 26*i* and the pad 26*h*. The slits 23*a* and 23*b* are areas on which the diffusion layer 22 is not formed and the slits 23*a* and 23*b* are areas with resistivity higher than that of the diffusion layer 22.

Further, in the IC 20 for heating of the present embodiment which is configured in the above-described manner, a potential difference is applied between the first area of the diffusion layer 22 electrically connected to the pads 26*a* and 26*i* and the second area of the diffusion layer 22 electrically connected to the pads 26*b*, 26*c*, 26*d*, 26*f*, 26*g*, and 26*h*, and the diffusion layer 22 (an example of a heating unit) is heated by the current flowing toward the second area from the first area. On the contrary, slits 23*a* and 23*b* (an example of a third area) arranged so as to intersect the virtual straight line connecting the first area and the second area of the diffusion layer 22 become areas with resistivity higher than that of the first area and the second area of the diffusion layer 22 due to application of a reverse voltage to diodes to be formed in the P type semiconductor substrate 21 and the N type diffusion layer 22, and are areas into which the current smaller than the current flowing into the first area and the second area of the diffusion layer 22 (an example of the heating unit) flows or areas into which the current does not flow. Accordingly, the slits 23*a* and 23*b* (an example of a third area) become areas having a heating amount smaller than that of the diffusion layer 22 (an example of the heating unit) or areas that do not heat up. That is, the slits 23*a* and 23*b* are areas with a heating amount smaller than that of the diffusion layer 22.

Accordingly, the current input from the pads 26*a* and 26*i* flows into the pads 26*b*, 26*c*, 26*d*, 26*f*, 26*g*, and 26*h* so as to bypass the slits 23*a* and 23*b*. In this manner, the current sufficiently flows into the area on which the resonator element 2 is mounted in the diffusion layer 22, and the resonator element 2 can be heated sufficiently.

In addition, in the present embodiment, arrangement of the pads 26*a*, 26*i*, 26*b*, 26*c*, 26*d*, 26*f*, 26*g*, and 26*h* is devised in order to efficiently heat the resonator element 2. Since the pads 26*a*, 26*i*, 26*b*, 26*c*, 26*d*, 26*f*, 26*g*, and 26*h* are connected to respective electrodes provided in the package 10 through wire bonding, the periphery of the pads 26*a*, 26*i*, 26*b*, 26*c*, 26*d*, 26*f*, 26*g*, and 26*h* becomes an area whose temperature is relatively low in the surface of the semiconductor substrate 21 due to radiation of heat from the wire. Accordingly, in the presents embodiment, the temperature of the area on which the resonator element 2 is mounted is not decreased (becomes relatively increased) by arranging the pads 26*a*, 26*i*, 26*b*, 26*c*, 26*d*, 26*f*, 26*g*, and 26*h* on the same side area, which is far from the area on which the resonator element 2 is mounted, along the outer peripheral edge of the semiconductor substrate 21. Further, the same side area is an area whose distance from an arbitrary first side becomes ⅓ or smaller of the length of a second side which is orthogonal to the first side and the same side area corresponds to an area X surrounded by one dot dashed line in FIG. 4. In this manner, according to the present embodiment, the resonator element 2 can be efficiently heated by dividing the IC 20 for heating into an area whose temperature is relatively high and an area whose temperature is relatively low and mounting the resonator element 2 on the area whose temperature is relatively high.

Figure 7:
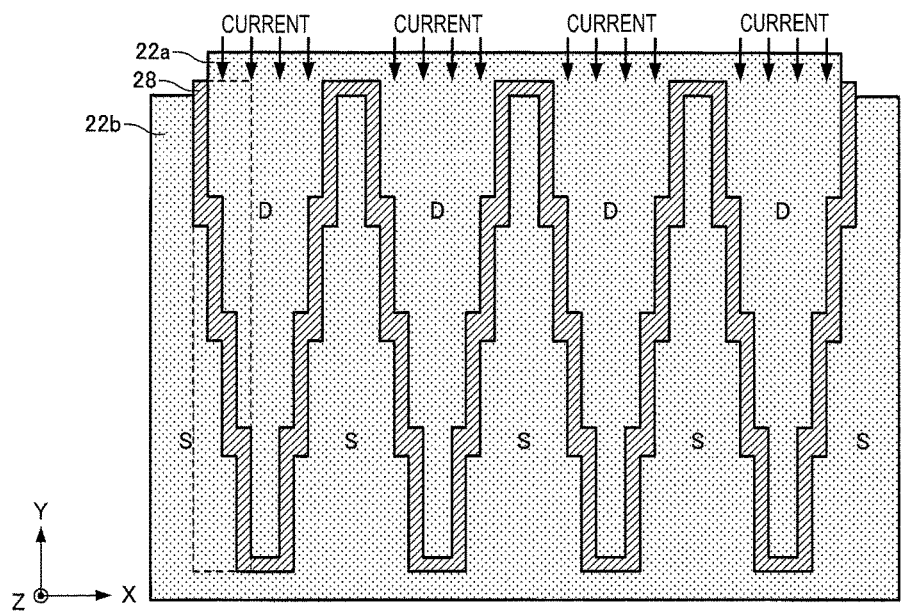
FIG. 7 is a view illustrating a part of a layout pattern of MOS transistors included in an IC for heating.
Figure 8:
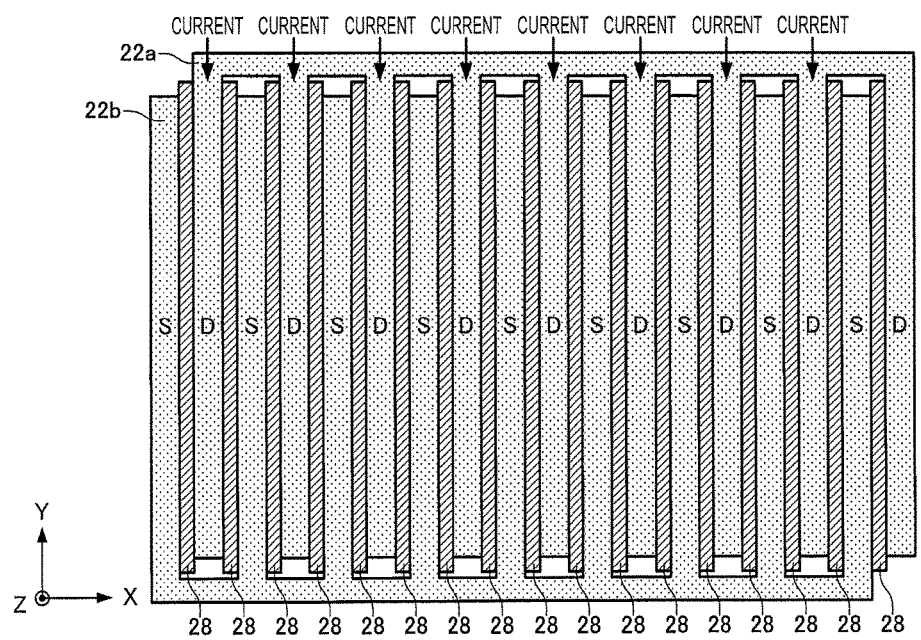
FIG. 8 is a view illustrating a part of a layout pattern of MOS transistors according to a comparative example.

Moreover, in the present embodiment, the layout pattern of MOS transistors 15 is devised in order to efficiently heat the resonator element 2. FIG. 7 is a view illustrating apart of the layout pattern of MOS transistors 15 of the present embodiment. Meanwhile, as a comparative example, FIG. 8 is a view illustrating a general layout pattern in a case where a plurality of MOS transistors are connected to one another in parallel. In FIGS. 7 and 8, the layout pattern other than a wiring 28 of a Poly layer functioning as a gate, a diffusion layer 22*a* functioning as a drain (D), and a diffusion layer 22*b* functioning as a source (S) is not illustrated.

In FIGS. 7 and 8, the MOS transistors 15 are configured such that a plurality of MOS transistors are connected to one another in parallel. In FIG. 8, Poly wirings 28 functioning as respective gates of the plurality of MOS transistors are separated from one another and are formed so as to be parallel to the Y axis respectively. Therefore, when sources (S) and drains (D) of respective MOS transistors are alternately formed in the X axis direction, the current flowing into the arrangement area of the MOS transistors 15 bypassing through the area on which the resonator element 2 is mounted concentrates on a portion of an area on which the drains (D) are formed. Accordingly, there is a concern that the density of the current flowing into the area on which the resonator element 2 is mounted is largely increased so that the resonator element 2 may not be efficiently heated.

In contrast, according to the present embodiment illustrated in FIG. 7, the Poly wirings 28 functioning as respective gates of the plurality of MOS transistors are formed to be stepwise with respect to the X axis direction and the Y axis direction as surrounded by the dashed line and are not separated from one another. That is, a stepwise pattern functioning as respective gates is continuous while folding back in the X axis direction and, as a whole, one Poly wiring in which an approximately V-shaped pattern is repeated is formed. Therefore, the width of the drains (D) of the respective MOS transistors in the X axis direction becomes larger as the drains get closer to the area on which the resonator element 2 is mounted, and the width of the sources (S) of respective MOS transistors in the X axis direction becomes larger as the sources get closer to the pads 26*b*, 26*c*, 26*d*, 26*e*, 26*f*, 26*g*, and 26*h* to be grounded. Therefore, since the current flowing into the arrangement area of the MOS transistors 15 by passing through the area on which the resonator element 2 is mounted is not concentrated on some area and the density of the current flowing into the area on which the resonator element 2 is mounted can be decreased, the resonator element 2 can be efficiently heated.

Further, in the present embodiment, wiring patterns which become a current path to the diffusion layer 22 from the pads 26*a* and 26*i* and a current path to the pads 26*b*, 26*c*, 26*d*, 26*f*, 26*g*, and 26*h* from the diffusion layer 22 are devised in order to prevent wiring destruction caused by electromigration. Since a wiring containing aluminum or aluminum as a main component has low resistance (EM resistance) against electromigration, when the wiring is extended in a direction orthogonal to a Z axis, the wiring width needs to be an order of several mm, which is not realistic. Here, in the present embodiment, as illustrated in FIGS. 5 and 6, the plurality of vias 25*a* electrically connecting the pad 26*a* and the diffusion layer 22 in a plan view are formed so as to overlap with the opening portion of the pad 26*a*. That is, a current input electrode configured of the pad 26*a* to which the current is input and the plurality of vias 25*a* is in the area on which the diffusion layer 22 is formed in a plan view, and the current flowing into the diffusion layer 22 through the current input electrode flows between the upper surface of the opening portion of the pad 26*a* and the lower surface of the via 25*a* in contact with the diffusion layer 22.

In the same manner, the plurality of vias (not illustrated) electrically connecting the pad 26*i* and the diffusion layer 22 are formed so as to overlap with the opening portion of the pad 26*i*. That is, the current input electrode configured of the pad 26*i* and the plurality of vias (not illustrated) is in the area on which the diffusion layer 22 is formed in a plan view, and the current flowing into the diffusion layer 22 through the current input electrode configured of the pad 26*i* and the plurality of vias flows between the upper surface of the opening portion of the pad 26*i* and the lower surface of the via (not illustrated) in contact with the diffusion layer 22.

That is, since a wiring electrically connecting the pads 26*a* and 26*i*, and the diffusion layer 22 and extending in a direction orthogonal to the Z axis is not present, the current flowing into the diffusion layer 22 from the pads 26*a* and 26*i* flows from the positive direction to the negative direction of the Z axis using a shortest path.

Further, in the present embodiment, as illustrated in FIGS. 5 and 6, the plurality of vias 25*b* electrically connecting the pad 26*b* and the diffusion layer 22 are formed so as to overlap with the opening portion of the pad 26*b* in a plan view. That is, the current input electrode configured of the pad 26*b* from which the current is output and the plurality of vias 25*b* is in the area on which the diffusion layer 22 is formed in a plan view, and the current flowing from the diffusion layer 22 through the current input electrode flows between the lower surface of the via 25*b* in contact with the diffusion layer 22 and the upper surface of the opening portion of the pad 26*b*.

In the same manner, the plurality of vias (not illustrated) electrically connecting the pads 26*c*, 26*d*, 26*f*, 26*g*, and 26*h* and the diffusion layer 22 are formed so as to respectively overlap with the opening portions of the pads 26*c*, 26*d*, 26*f*, 26*g*, and 26*h*. That is, each of the current output electrodes configured of the pads 26*c*, 26*d*, 26*f*, 26*g*, and 26*h* and the plurality of vias (not illustrated) is in the area on which the diffusion layer 22 is formed in a plan view, and the current flowing from the diffusion layer 22 through the current output electrode flows between the lower surface of the via (not illustrated) in contact with the diffusion layer 22 and the upper surface of the respective opening portions of the pads 26c, 26d, 26f, 26g, and 26h.

That is, since a wiring electrically connecting the pads 26b, 26c, 26d, 26f, 26g, and 26h, and the diffusion layer 22 respectively and extending in the direction orthogonal to the Z axis is not present, the current flowing into the pads 26b, 26c, 26d, 26f, 26g, and 26h from the diffusion layer 22 flows from the negative direction to the positive direction of the Z axis using a shortest path.

In this manner, in the present embodiment, since the current flowing into the diffusion layer 22 flows into the rear surface from the surface of the current input electrode and flows into the front surface from the rear surface of the current output electrode, the total area (accurately, the total area of the vias overlapping with an area to which a bonding wire is connected in a plan view) of vias on an XY plane can be considered as the cross-sectional area of the current input electrode or the current output electrode, and accordingly, it is possible to realize sufficient EM resistance.

Further, according to the oven controlled quartz crystal oscillator (OCXO) of the first embodiment, the current flowing between the pads 26a and 26i functioning as power source terminals and the pads 26b, 26c, 26d, 26f, 26g, and 26h functioning as ground terminals flows so as to bypass the slits 23a and 23b with resistivity higher than that of the diffusion layer 22 and flows into a path longer than the straight line connecting the pad 26a and the pad 26b or the straight line connecting the pad 26i and the pad 26h, and thus, the area on which the resonator element 2 is mounted can be efficiently heated.

Moreover, according to the oven controlled quartz crystal oscillator (OCXO) of the first embodiment, the peripheral area of the pads 26a, 26b, 26c, 26d, 26f, 26g, 26h, and 26i which is an area whose temperature is relatively low in the surface of the semiconductor substrate 21 due to radiation of heat because the area is connected to the electrode formed on the package 10 by a bonding wire can be restricted to a same side area X. Therefore, the area whose temperature of the surface of the semiconductor substrate 21 is low is concentrated on a portion so that a decrease in heating efficiency of the area on which the resonator element 2 is mounted due to radiation of heat from the bonding wire can be prevented.

In addition, according to the oven controlled quartz crystal oscillator (OCXO) of the first embodiment, it is possible to easily form the diffusion layer 22 on the surface of the semiconductor substrate 21 so as to have a desired shape.

Further, according to the oven controlled quartz crystal oscillator (OCXO) of the first embodiment, since the current input electrode inputting the current to the diffusion layer 22 formed in the semiconductor substrate 21 and the current output electrode outputting the current thereto are arranged such that the current flows between the surface in contact with the diffusion layer 22 and the rear surface thereof, the thicknesses of the current input electrode and the current output electrode are the distance that the current flows and the areas of the current input electrode and the current output electrode are the cross-sectional area that the current flows. Accordingly, since the density of the current flowing into the current input electrode and the current output electrode can be decreased and the distance that the current flows can be shortened, the possibility of disconnection caused by electromigration can be decreased.

In addition, according to the oven controlled quartz crystal oscillator (OCXO) of the first embodiment, since the resonator element 2 is mounted on the surface of the IC 20 for heating, the conductivity of heat generated from the IC 20 for heating is excellent and the resonator element 2 can be efficiently heated while the current flowing into the IC 20 for heating is reduced.

1-2. Second Embodiment

In the oven controlled quartz crystal oscillator (OCXO) of the first embodiment, since the resistance value of the resistor 14 formed of the diffusion layer 22 is extremely high in some cases, a resistor 14 is realized by a diffusion resistance layer which is configured of a diffusion layer and a conductive layer and whose resistivity is decreased in an oven controlled quartz crystal oscillator (OCXO) of the second embodiment.

Figure 9:
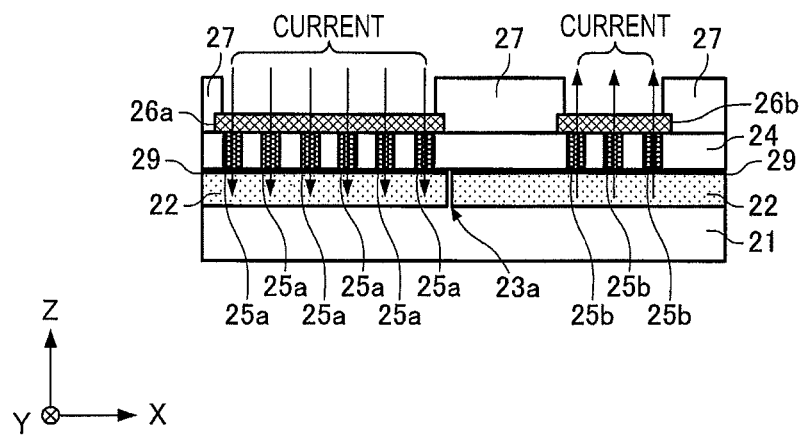
FIG. 9 is a side view of a rectangular area A of an IC for heating when seen from a direction of an arrow B in an oven controlled quartz crystal oscillator (OCXO) according to a second embodiment.

Since a layout pattern of an IC 20 for heating in the oven controlled quartz crystal oscillator (OCXO) of the second embodiment is the same as that of FIG. 4, the illustration is omitted. FIG. 9 is a side view of a rectangular area A of FIG. 4 when seen from a direction of an arrow B in the oven controlled quartz crystal oscillator (OCXO) according to the second embodiment. In FIG. 9, the illustration of MOS transistors arranged on the arrangement area of the MOS transistors of FIG. 4 is omitted.

As illustrated in FIG. 9, in the present embodiment, a silicide 29 which is a conductive layer is formed on the surface of the diffusion layer 22. The diffusion resistance layer formed of the diffusion layer 22 and the silicide 29 functions as the resistor 14 illustrated in FIG. 3A and 3B.

Since other configurations in the second embodiment are the same as those of the first embodiment, the illustration and the description thereof are omitted.

According to the oven controlled quartz crystal oscillator (OCXO) of the second embodiment, since the diffusion resistance layer has relatively low resistivity by forming the silicide 29, which is a conductive layer, on the surface of the diffusion layer 22, it is possible to prevent the heating amount from being excessive so that the heating amount can be appropriate. Further, it is possible to adjust the resistivity of the diffusion resistance layer to have a desired value using the conductive layer and the degree of freedom of design can be increased.

In addition, the oven controlled quartz crystal oscillator (OCXO) of the second embodiment has the same effect as those of the oven controlled quartz crystal oscillator (OCXO) of the first embodiment.

1-3. Third Embodiment

In the oven controlled quartz crystal oscillator (OCXO) of the first embodiment, the slit 23a is formed so as to intersect the virtual straight line connecting the pads 26a and 26b and the slit 23b is formed so as to intersect the virtual straight line connecting the pads 26i and 26h. Whereas, in an oven controlled quartz crystal oscillator (OCXO) of a third embodiment, two MOS transistors in an OFF state are arranged in place of the slits 23a and 23b and the current flows into the diffusion layer 22 so as to bypass the MOS transistors.

Figure 10:
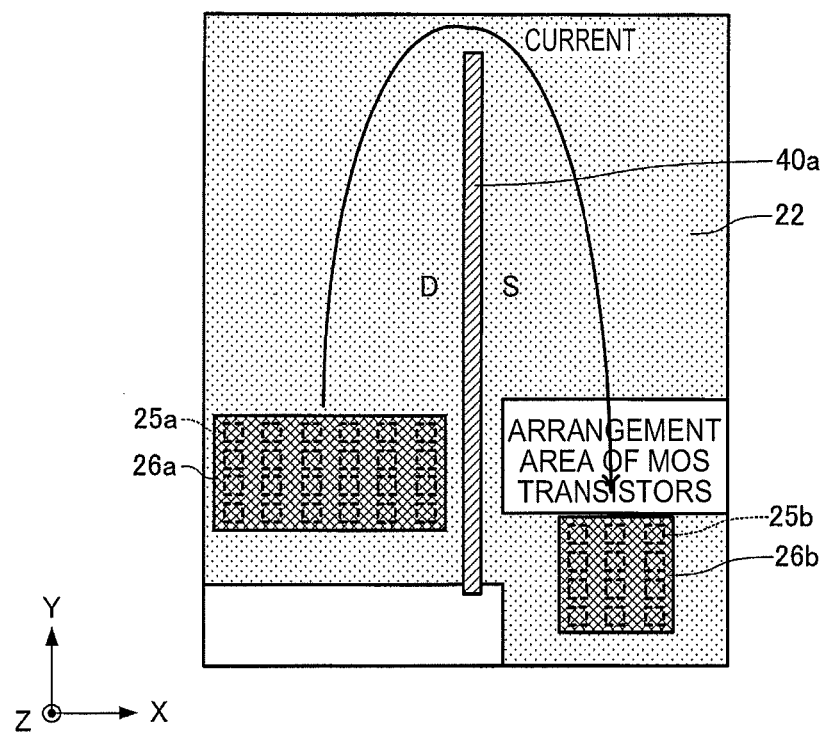
FIG. 10 is an enlarged view of an area corresponding to a rectangular area A of an IC for heating in an oven controlled quartz crystal oscillator (OCXO) according to a third embodiment.
Figure 11:
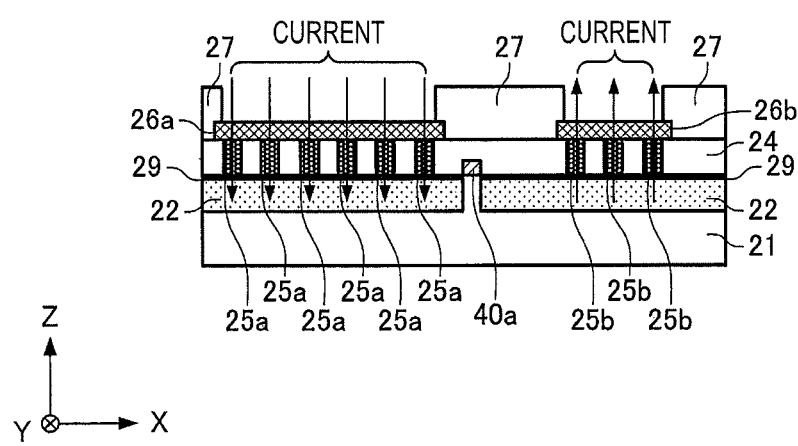
FIG. 11 is a side view of an area corresponding to a rectangular area A of an IC for heating when seen from a direction of an arrow B in an oven controlled quartz crystal oscillator (OCXO) according to a third embodiment.

Since a layout pattern of an IC 20 for heating in the oven controlled quartz crystal oscillator (OCXO) of the third embodiment is the same as that of FIG. 4 except that two MOS transistors are provided in place of the slits 23a and 23b, the illustration is omitted. FIG. 10 is an enlarged view of an area corresponding to the rectangular area A of FIG. 4 in the oven controlled quartz crystal oscillator (OCXO) according to the third embodiment, and FIG. 11 is a side view of an area corresponding to the rectangular area A when seen from a direction of an arrow B according to a third embodiment. In addition, the illustration of MOS transistors arranged in the arrangement area of the MOS transistors of FIG. 4 is omitted in FIG. 11.

As illustrated in FIGS. 10 and 11, in the present embodiment, a Poly wiring 40a is arranged on the surface of the semiconductor substrate 21 so as to intersect a virtual straight line (straight line connecting the gravity center of the pad 26a and the gravity center of pad 26b) connecting the pads 26a and 26b and a MOS transistor (an example of a transistor) using the Poly wiring 40a as a gate, the diffusion layer 22 on the pad 26a side as a drain (D), and the diffusion layer 22 on the pad 26b side as a source (S) is formed. Further, although the illustration is omitted, a Poly wiring is arranged so as to intersect a virtual straight line (straight line connecting the gravity center of the pad 26i and the gravity center of pad 26h) connecting the pads 26i and 26h and a MOS transistor (an example of a transistor) using the Poly wiring as a gate, the diffusion layer 22 on the pad 26i side as a drain (D), and the diffusion layer 22 on the pad 26h side as a source (S) is formed.

The gates of these two MOS transistors are electrically connected to pads 26b, 26c, 26d, 26f, 26g, and 26h by the wiring pattern (not illustrated) and are grounded. In this manner, two MOS transistors are turned OFF, a channel is not formed immediately below the gates, and the current does not flow into the source from the drain or the current flowing into the area on which two MOS transistors are formed is less than the current flowing into the diffusion layer 22. That is, the area (an example of the third area) on which two MOS transistors are arranged is an area with resistivity higher than that of the diffusion layer 22 and the current input from the pads 26a and 26i flows into the pads 26b, 26c, 62d, 26f, 26g, and 26h so as to bypass the area on which the two MOS transistors are arranged. Therefore, according to the oven controlled quartz crystal oscillator (OCXO) of the third embodiment, the current flows into the area on which the resonator element 2 is mounted in the diffusion layer 22, and thus, the resonator element 2 can be efficiently heated. In addition, the example in which gates of two MOS transistors are grounded has been described in the present embodiment, but the embodiment is not limited thereto, and the path of the current flowing among the pads 26b, 26c, 26d, 26f, 26g, and 26h from the pads 26a and 26i may be controlled by applying a signal to the gates of the two MOS transistors using a wiring (not illustrated) and controlling (ON and OFF operation) an operation of the two MOS transistors.

In addition, the oven controlled quartz crystal oscillator (OCXO) of the third embodiment has the same effects as those of the oven controlled quartz crystal oscillator (OCXO) of the first embodiment.

1-4. Fourth Embodiment

In the oven controlled quartz crystal oscillator (OCXO) of the first embodiment, respective electrodes formed in the pads 26a to 26k and the package 10 formed on the surface of the insulation layer 24 in the IC 20 for heating are connected with one another by a bonding wire, and the pad 26l and the lower surface electrode of the resonator element 2 are connected with each other by the conductive member 13. In contrast, in the oven controlled quartz crystal oscillator (OCXO) of the fourth embodiment, a re-wiring layer is provided on the surface of a surface protective film 27 in the IC 20 for heating, and a pad formed on the re-wiring layer, the lower surface electrode of the resonator element 2, and the electrode formed in the package 10 are connected with one another.

Figure 12:
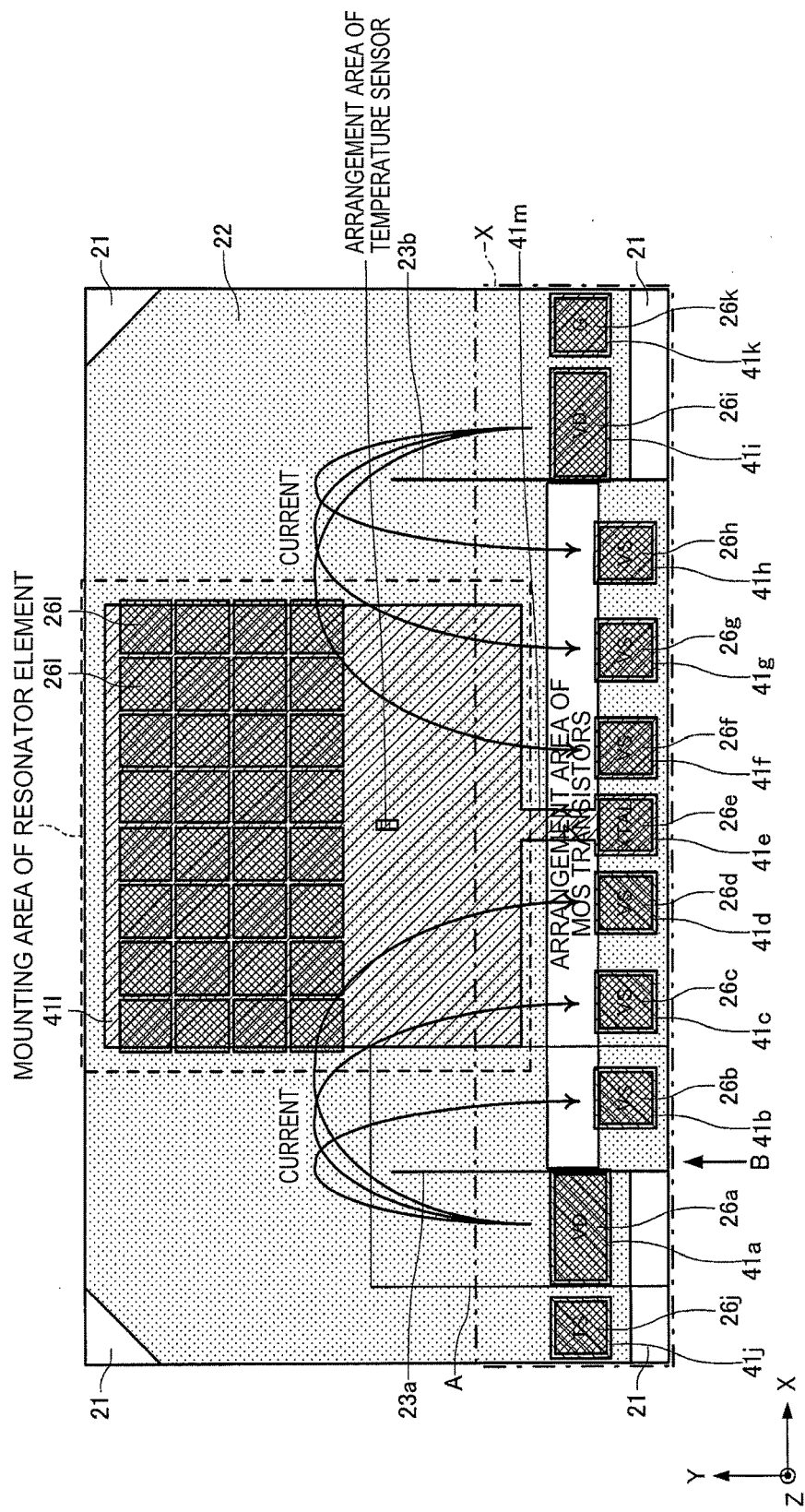
FIG. 12 is a view schematically illustrating a layout pattern of an IC for heating in an oven controlled quartz crystal oscillator (OCXO) according to a fourth embodiment.
Figure 13:
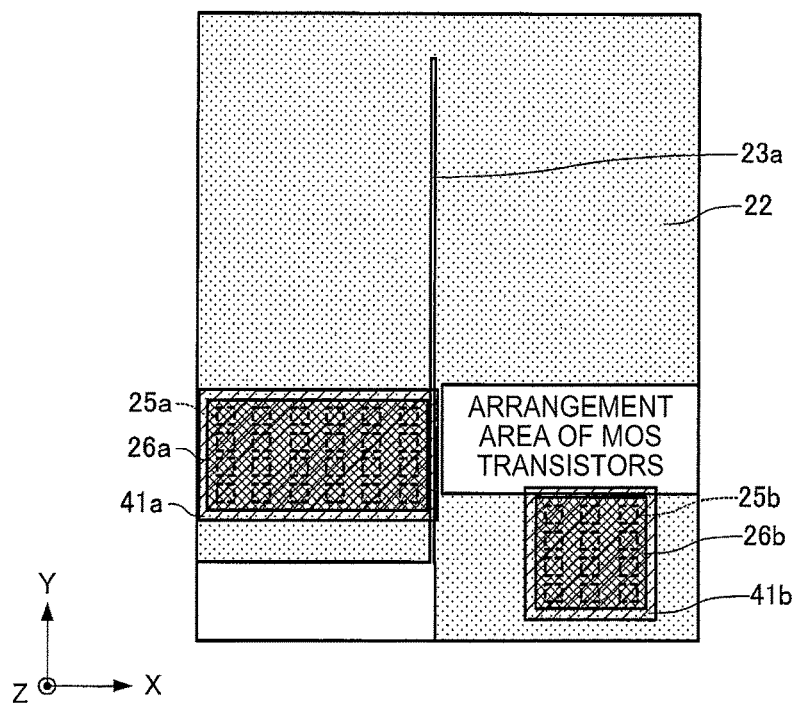
FIG. 13 is an enlarged view of the rectangular area A of FIG. 12.
Figure 14:
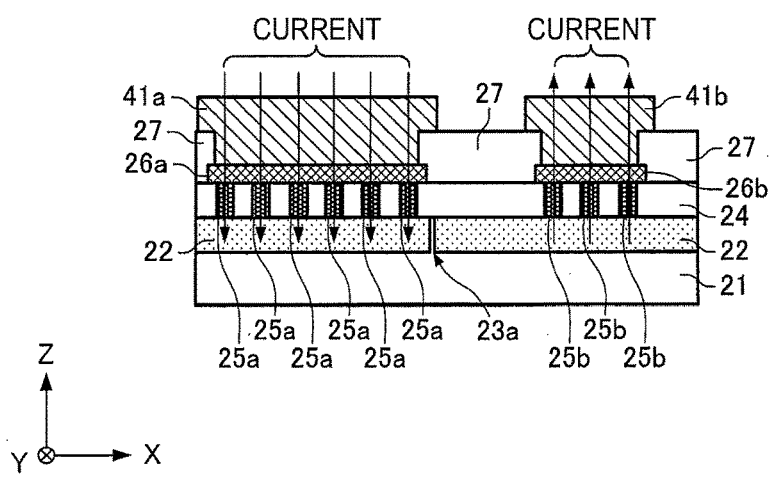
FIG. 14 is a side view of the rectangular area A of FIG. 12 when seen from the direction of an arrow B.

FIG. 12 is a view schematically illustrating a layout pattern of the IC 20 for heating in the oven controlled quartz crystal oscillator (OCXO) according to the fourth embodiment. Further, FIG. 13 is an enlarged view of the rectangular area A of FIG. 12. FIG. 14 is a side view of the rectangular area A of FIG. 12 when seen from the direction of an arrow B. FIG. 12 illustrates only some of the layers, and the illustration of MOS transistors arranged in the arrangement area of the MOS transistors of FIG. 12 is omitted in FIG. 14.

As illustrated in FIGS. 12 to 14, in the present embodiment, rectangular electrodes 26a to 26l are formed on the surface of the insulation layer 24 in the opening portion of the front surface protective film 27, the re-wiring layer is provided on the surface (including the opening portion) of the front surface protective film 27 (an example of the insulation layer), and rectangular pads 41a to 41l are formed on the re-wiring layer.

The pad 41a is a pad functioning as the power source terminal VD illustrated in FIGS. 3A and 3B, overlapping with a plurality of vias 25a connected to the electrode 26a and the electrode 26a in a plan view, and electrically connected to the upper surface of the opening portion of the electrode 26a. In the same manner, the pad 41i is a pad functioning as the power source terminal VD, overlapping with a plurality of vias connected to the electrode 26i and the electrode 26i in a plan view, and electrically connected to the upper surface of the opening portion of the electrode 26a.

The pad 41b is a pad functioning as the ground terminal VS illustrated in FIGS. 3A and 3B, overlapping with a plurality of vias 25b connected to the electrode 26b and the electrode 26b in a plan view, is connected to the upper surface of the opening portion of the electrode 26b. In the same manner, the pads 41c, 41d, 41f, 41g, and 41h are pads functioning as the ground terminal VS, overlapping with a plurality of vias (not illustrated) connected to the electrodes 26c, 26d, 26f, 26g, and 26h respectively and the electrodes 26c, 26d, 26f, 26g, and 26h respectively in a plan view, and connected to the upper surfaces of the opening portions of the electrodes 26c, 26d, 26f, 26g, and 26h.

The pad 41j is a pad functioning as the output terminal TS as illustrated in FIGS. 3A and 3B, overlapping with the electrode 26j in a plan view, and connected to the upper surface of the electrode 26j.

The pad 41k is a pad functioning as the input terminal G as illustrated in FIGS. 3A and 3B, overlapping with the electrode 26k in a plan view, and connected to the upper surface of the electrode 26k.

The pad 41l is overlapping with 32 electrodes 26l in a plan view and connected to the upper surfaces of the thirty two electrodes 26l. The pad 41l is formed so as to overlap with the area on which the resonator element 2 is mounted indicated by a dashed line in FIG. 12 in a plan view.

Further, the pad 41e is overlapping with the electrode 26e in a plan view and connected to the upper surface of the electrode 26e.

In addition, a wiring 41m for connecting thirty two pads 41l and the pad 41e is formed on the re-wiring layer.

The pads 41a to 41l and the wiring 41m formed on the re-wiring layer are copper or alloys having copper as a main component, which have resistivity lower than that of the electrodes 26a to 26l (for example, aluminum or alloys having aluminum as a main component). Moreover, in order to reliably maintain connectivity with a bonding wire or connectivity with a conductive bonding member, the surface may be covered with, for example, gold, aluminum, alloys containing gold and aluminum as main components.

Since other configurations of the oven controlled quartz crystal oscillator (OCXO) of the fourth embodiment are the same as those of the oven controlled quartz crystal oscillator (OCXO) of the first embodiment, the illustration and the description thereof are omitted.

Similar to the first embodiment, even in the present embodiment, the slit 23a is formed on the surface of the semiconductor substrate 21 so as to intersect a virtual straight line (straight line connecting the gravity center of the electrode 26a and the gravity center of electrode 26b) connecting the electrodes 26a and 26b, and the slit 23b is formed so as to intersect a virtual straight line (straight line connecting the gravity center of the electrode 26i and the gravity center of electrode 26h) connecting the electrodes 26i and 26h. Therefore, according to the oven controlled quartz crystal oscillator (OCXO) according to the fourth embodiment, the current input from the pads 41a and 41i flows into the pads 41b, 41c, 41d, 41e, 41f, 41g, and 41h so as to bypass the slits 23a and 23b. In this manner, the current sufficiently flows into the area on which the resonator element 2 is mounted in the diffusion layer 22 and the resonator element 2 can be efficiently heated.

Moreover, similar to the first embodiment, even in the present embodiment, the upper surface of the opening portion of the electrode 26a and the plurality of vias 25a are formed so as to overlap with the area on which the pad 41a is formed and the current flowing into the diffusion layer 22 through the current input electrode configured of the electrode 26a and the plurality of vias 25a from the pad 41a flows between the upper surface of the opening portion of the electrode 26a and the lower surface of the via 25a, as illustrated in FIGS. 13 and 14 in a plan view. In the same manner, the electrode 26i and the plurality of vias (not illustrated) are formed so as to overlap with the area on which the pad 41i is formed and the current flowing into the diffusion layer 22 through the current input electrode configured of the electrode 26i and the plurality of vias (not illustrated) from the pad 41i flows between the upper surface of the opening portion of the electrode 26i and the lower surface of the via (not illustrated).

That is, since a wiring electrically connecting the upper surface of the opening portion of the electrode 26a, the upper surface of the opening portion of the electrode 26i, and the diffusion layer 22 respectively and extending in a direction orthogonal to the Z axis is not present, the current flowing into the diffusion layer 22 from the pads 41a and 41i flows from the positive direction to the negative direction of the Z axis using a shortest path.

Moreover, in the present embodiment, as illustrated in FIGS. 13 and 14 in a plan view, the upper surface of the opening portion of the electrode 26b and the plurality of vias 25b are formed so as to overlap with the area on which the pad 41b is formed, and the current flowing into the pad 41b through the current output electrode configured of the electrode 26b and the plurality of vias 25b from the diffusion layer 22 flows between the lower surface of the via 25b and the upper surface of the opening portion of the electrode 26b. In the same manner, the plurality of vias (not illustrated) electrically connecting the upper surfaces of the opening portions of the electrodes 26c, 26d, 26f, 26g, and 26h and the diffusion layer 22 are formed so as to overlap with the area on which the pads 41c, 41d, 41f, 41g, and 41h are formed, and the current flowing into the pads 41c, 41d, 41f, 41g, and 41h through respective current output electrodes configured of the upper surfaces of the opening portions of the electrodes 26c, 26d, 26f, 26g, and 26h and the plurality of vias (not illustrated) from the diffusion layer 22 flows between the lower surface of the via (not illustrated) and the opening portions of the electrodes 26c, 26d, 26f, 26g, and 26h.

That is, since a wiring electrically connecting the upper surfaces of the opening portions of the electrodes 26b, 26c, 26d, 26f, 26g, and 26h and the diffusion layer 22 respectively and extending in a direction orthogonal to the z axis is not present, the current flowing into the pads 41b, 41c, 41d, 41f, 41g, and 41h from the diffusion layer 22 flows from the negative direction to the positive direction of the Z axis using a shortest path.

In this manner, according to the oven controlled quartz crystal oscillator (OCXO) of the fourth embodiment, since the current flowing into the diffusion layer 22 flows into the rear surface from the front surface of the current input electrode and flows into the front surface from the rear surface of the current output electrode, the total area (accurately, the total area of the vias overlapping with an area to which a bonding wire is connected in a plan view) of vias on an XY plane can be considered as the cross-sectional area of the current input electrode or the current output electrode, and the density of the current flowing into the current input electrode and the current output electrode can be decreased and the distance that the current flows can be shortened, and accordingly, it is possible to realize sufficient EM resistance.

Further, since the wiring of the re-wiring layer has low resistivity and the sufficient EM resistance can be obtained by increasing the thickness, a wiring for inputting or outputting the current flowing into the diffusion layer 22 maybe formed in the direction orthogonal to the Z axis in the re-wiring layer.

In addition, the oven controlled quartz crystal oscillator (OCXO) of the fourth embodiment has the same effects as those of the oven controlled quartz crystal oscillator (OCXO) of the first embodiment.

1-5. Fifth Embodiment

In the oven controlled quartz crystal oscillator (OCXO) of the first embodiment, the resonator element 2 is bonded and fixed to the pad 26l of the IC 20 for heating and the pad 26e of the IC 20 for heating is wire-bonded to the electrode of the package 10 in order to electrically connect the lower surface electrode of the resonator element 2 and the terminal of the IC 30 for oscillation, but, in the oven controlled quartz crystal oscillator (OCXO) of the fifth embodiment, the resonator element 2 has a configuration (configuration with two upper surface electrodes) without a lower surface electrode, and two upper surface electrodes of the resonator element 2 and two electrodes of the package 10 are wire-bonded. Therefore, in the fifth embodiment, a pad for electrically connecting the resonator element 2 and the electrode of the package 10 becomes unnecessary for the IC 20 for heating.

Figure 15:
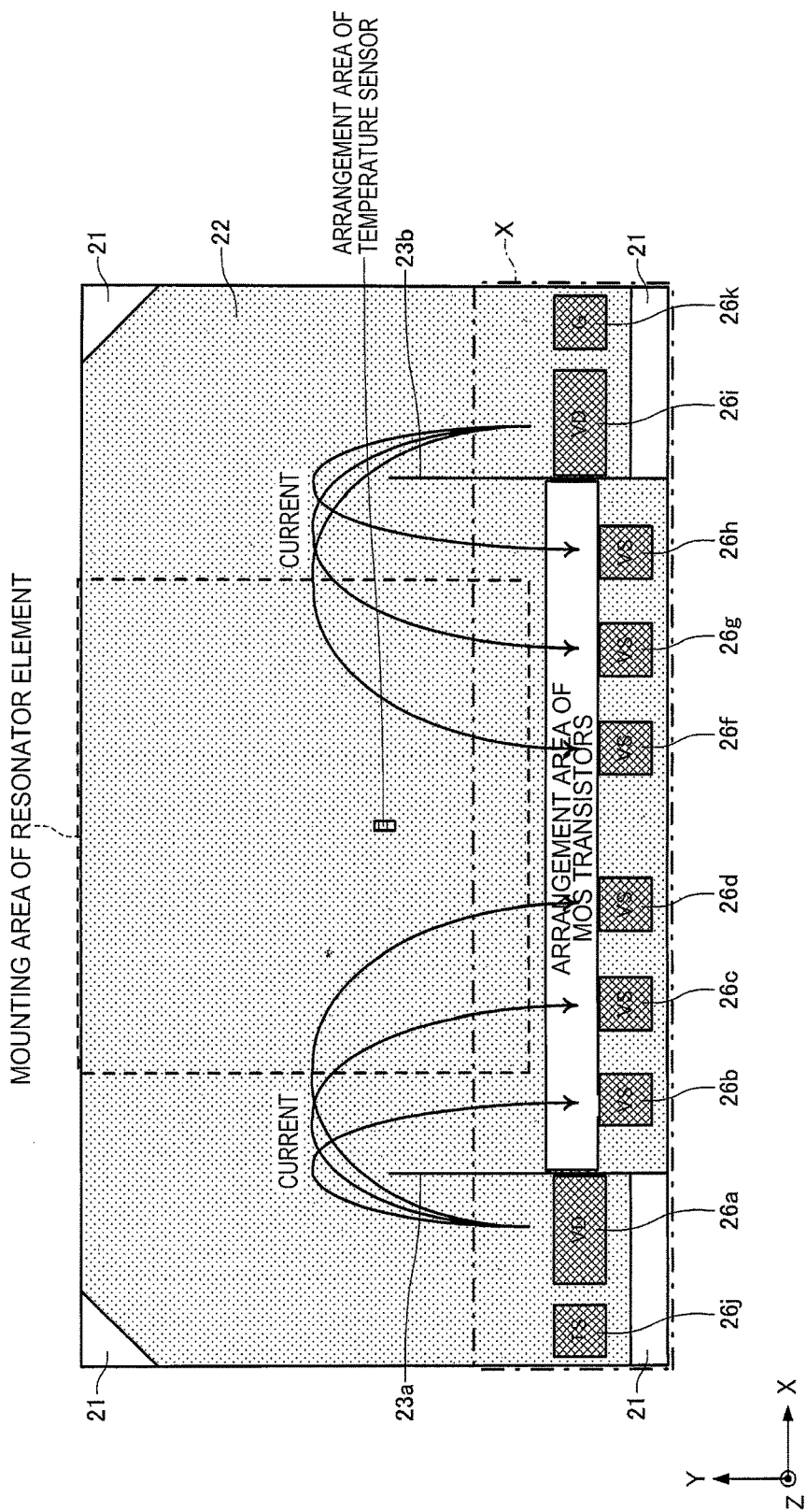
FIG. 15 is a view schematically illustrating a layout pattern of an IC for heating in an oven controlled quartz crystal oscillator (OCXO) according to a fifth embodiment.

FIG. 15 is a view schematically illustrating a layout pattern of the IC 20 for heating in the oven controlled quartz crystal oscillator (OCXO) according to the fifth embodiment. Further, FIG. 15 illustrates only some of the layers. As illustrated in FIG. 15, the pad 26e and the plurality of pads 26l are not present in the IC 20 for heating according to the fifth embodiment when compared to the IC 20 for heating of the first embodiment illustrated in FIG. 4, and the area on which the resonator element 2 is mounted is covered with a surface protective film of the insulator. It is preferable that the surface protective film have high heat conductivity.

In addition, in the present embodiment, the resonator element 2 is bonded and fixed onto the upper surface of the surface protective film formed in the area on which the resonator element 2 of the IC 20 for heating is mounted through a bonding member. Alternatively, a conductor may be interposed between the resonator element 2 and the IC 20 for heating.

Since other configurations of the oven controlled quartz crystal oscillator (OCXO) of the fifth embodiment are the same as those of the oven controlled quartz crystal oscillator (OCXO) of the first embodiment, the illustration and the description thereof are omitted.

According to the oven controlled quartz crystal oscillator (OCXO) of the fifth embodiment, even though the resonator element 2 and the IC 20 for heating are not connected to each other through an electrode, the resonator element 2 can be efficiently heated through the IC 20 for heating similar to the first embodiment.

In addition, the oven controlled quartz crystal oscillator (OCXO) of the fifth embodiment has the same effects as those of the oven controlled quartz crystal oscillator (OCXO) of the first embodiment.

2. Electronic apparatus

Figure 16:
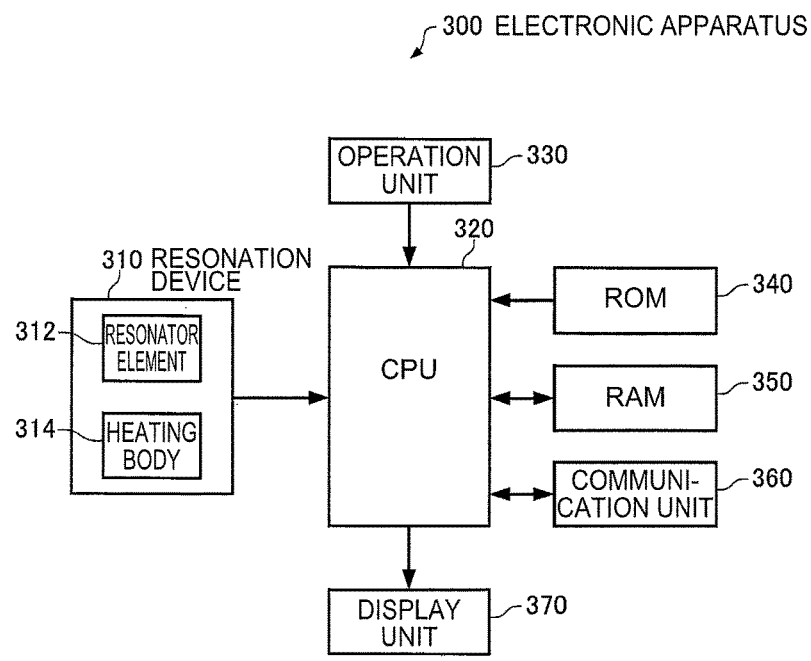
FIG. 16 is a functional block diagram of an electronic apparatus according to the present embodiment.

FIG. 16 is a functional block diagram of an electronic apparatus according to the present embodiment. An electronic apparatus 30 of the present embodiment includes a vibration device 310, a central processing unit (CPU) 320, an operation unit 330, a read only memory (ROM) 340, a random access memory (RAM) 350, a communication unit 360, and a display unit 370. Further, the electronic apparatus of the present embodiment may have a configuration in which some of constituent elements (respective units) of FIG. 16 are omitted or changed or to which other constituent elements are added.

The vibration device 310 includes a resonator element 312 and a heating body 314 and generates an oscillation signal based on oscillation of the resonator element 312 heated by the heating body 314. The oscillation signal is output to the CPU 320.

The CPU 320 executes various calculation processing or control processing based on the oscillation signal input from the vibration device 310 according to programs stored in the ROM 340 or the like. Moreover, the CPU 320 executes various processing according to an operation signal from the operation unit 330, processing of controlling the communication unit 360 for data communication with external devices, and processing of sending a display signal for displaying various pieces of information to the display unit 370.

The operation unit 330 is an input device configured of an operation key or a button switch and outputs an operation signal in accordance with an operation performed by a user to the CPU 320.

The ROM 340 stores programs or data for the CPU 320 to execute various calculation processing or control processing.

The RAM 350 is used as a working area of the CPU 320 and temporarily stores programs or data read from the ROM 340; data input from the operation unit 330; and results of arithmetic processing or the like executed by the CPU 320 according to various programs.

The communication unit 360 performs various control operations for achieving data communication between the CPU 320 and external devices.

The display unit 370 is a display device configured of a liquid crystal display (LCD) and displays various pieces of information based on a display signal input from the CPU 320. A touch panel functioning as the operation unit 330 may be provided in the display unit 370.

It is possible to reduce power consumption and realize an electronic apparatus with high reliability by, for example, employing the IC 20 for heating of each embodiment described above as the heating body 314 or employing the oven controlled quartz crystal oscillator (OCXO) 1 of each embodiment described above as the vibration device 310.

Various electronic apparatuses can be considered as the electronic apparatus 300 described above, and examples thereof include personal computers (for example, a mobile personal computer, a laptop personal computer, and a tablet personal computer), mobile terminals such as a smart phone and a cellular phone, a digital still camera, an ink jet ejecting apparatus (for example, an ink jet printer), storage area network equipment such as a routers or a switch, local area network equipment, equipment for a mobile terminal base station, a TV, a video camera, a video recorder, a car navigation apparatus, a real-time clock apparatus, a pager, electronic organizer (with a communication function), an electronic dictionary, a calculator, electronic game equipment, a controller for a game, a word processor, a workstation, a TV phone, a TV monitor for security, electronic binoculars, a POS terminal, medical equipment (for example, an electronic thermometer, a blood pressure meter, a blood sugar meter, an electrocardiogram measuring device, an ultrasonic diagnostic apparatus, or an electronic endoscope), a fishfinder, various measuring instruments, meters (meters of a vehicle, an aircraft, and a ship), a flight simulator, a head-mounted display, a motion trace, a motion tracking apparatus, a motion controller, and a pedestrian dead reckoning (PDR) apparatus.

3. Moving object

Figure 17:
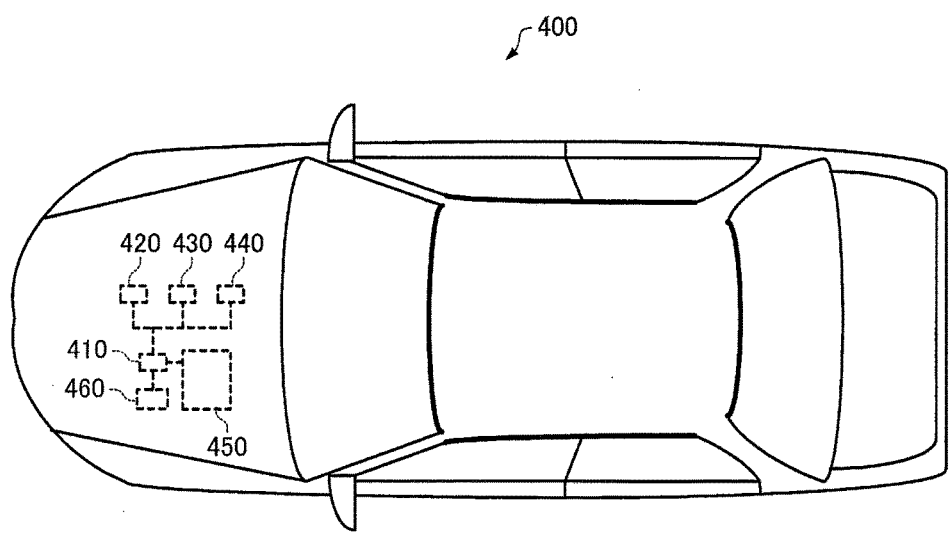
FIG. 17 is a view illustrating an example of a moving object according to the present embodiment.

FIG. 17 is a view (top view) illustrating an example of a moving object of the present embodiment. A moving object 400 illustrated in FIG. 17 includes a vibration device 410; controllers 420, 430, and 440 that perform various controlling operations on an engine system, a brake system, a keyless entry system; a battery 450; and a backup battery 460. Further, the moving object of the present embodiment may have a configuration in which some of constituent elements (respective units) of FIG. 17 are omitted or to which other constituent elements are added.

The vibration device 410 includes a resonator element (not illustrated) and a heating body and generates an oscillation signal based on oscillation of the resonator element heated by the heating body. The oscillation signal is output to the controllers 420, 430, and 440 from the vibration device 410.

The battery 450 supplies power to the vibration device 410 and the controllers 420, 430, and 440. The backup battery 460 supplies power to the vibration device 410 and the controllers 420, 430, and 440 when an output voltage of the battery 450 is lower than a threshold value.

It is possible to reduce power consumption and realize a moving object with high reliability by, for example, employing the IC 20 for heating of each embodiment described above as the heating body included in the vibration device 410 or employing the oven controlled quartz crystal oscillator (OCXO) 1 of each embodiment described above as the vibration device 410.

Various moving bodies can be considered as the moving object 400 described above, and examples thereof include automobiles (including an electric automobile); aircrafts such as jets or helicopters; ships; rockets; and satellites.

The invention is not limited to the present embodiment and various modifications are possible within the range not departing from the scope of the invention.

Figure 18:
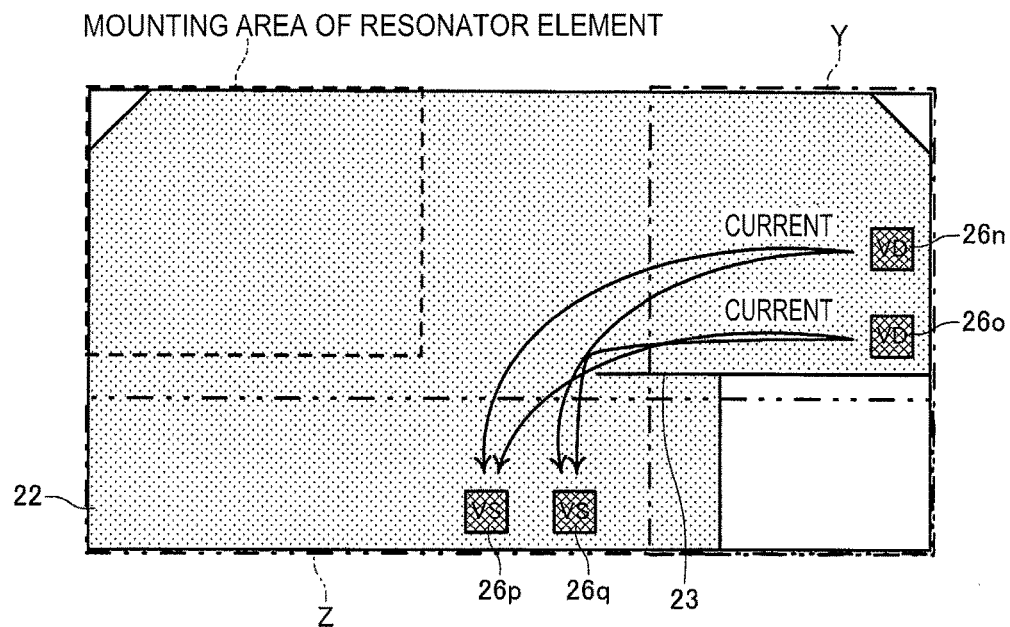
FIG. 18 is a view schematically illustrating a modification example of a layout pattern of an IC for heating.

For example, in each of the embodiments described above, pads (or electrodes) 26*a*, 26*b*, 26*c*, 26*d*, 26*f*, 26*g*, 26*h*, 26*i* functioning as the power source terminal VD and the ground terminal VS are arranged in the same side area far from the area on which the resonator element 2 is mounted in the IC 20 for heating, but the invention is not limited thereto. For example, as illustrated in FIG. 18, the current flowing from pads (or electrodes) 26*n* and 26*o* to pads (or electrodes) 26*p* and 26*q* through the diffusion layer 22 may bypass a slit 23 by arranging the pads (or electrode) 26*n* and 26*o* functioning as the power source terminal VD on the same side area Y, arranging the pads (or electrodes) 26*p* and 26*q* functioning as the ground terminal VS on the same side area Z intersecting the same side area Y, and providing an area with high resistivity such as a slit 23 or the like. In this case, the periphery of the pads (or electrodes) 26*n*, 26*o*, 26*p*, and 26*q* becomes an area whose temperature is relatively low in the surface of the semiconductor substrate 21 and the area which is close to a corner farthest from the pads (or electrodes) 26*n*, 26*o*, 26*p*, and 26*q* becomes an area whose temperature is relative high. Therefore, the resonator element 2 can be efficiently heated by using the area whose temperature is relatively high as the area on which the resonator element 2 is mounted.

For example, in each of the embodiments described above, the current flows into the diffusion resistance layer so as to bypass an area with high resistivity by arranging the slit 23*a* or 23*b* or the MOS transistor as an area with high resistivity between the pad (or the electrode) 26*a* or 26*i* functioning as the power source terminal VD and the pad (or the electrode) 26*b* or 26*h* functioning as the ground terminal VS, but an area with high resistivity may be realized by forming grooves on the surface of the semiconductor substrate 21 in place of the slit or the MOS transistor.

The above-described embodiments and modification examples are merely examples and the invention is not limited thereto. For example, respective embodiments and respective modification examples may be appropriately combined.

The invention includes configurations (for example, configurations with the same functions, the same methods, and the same results, or configurations with the same purposes and the same results) which are substantially the same as the configurations described in the embodiments. Further, the invention includes configurations in which non-essential parts of the configurations described in the embodiments are replaced. Further, the invention includes configurations exhibiting the same effects as those of the configurations described in the embodiments or includes configurations capable of realizing the same purposes as those of the configurations described in the embodiments. Furthermore, the invention includes configurations obtained by adding known techniques to the configurations described in the embodiments.

The entire disclosure of Japanese Patent Application No. 2013-265769, filed Dec. 24, 2013 is expressly incorporated by reference herein.

What is claimed is:

1. A heating body comprising:
   a semiconductor substrate on which a diffusion resistance layer is formed;
   a first electrode that applies a first voltage to the diffusion resistance layer; and
   a second electrode that applies a second voltage to the diffusion resistance layer,
   wherein the semiconductor substrate includes an area with resistivity higher than that of the diffusion resistance layer so as to intersect a virtual straight line connecting the first electrode and the second electrode when the semiconductor substrate is seen in a plan view.

2. The heating body according to claim 1, wherein the area with high resistivity is an area on which the diffusion resistance layer is not formed.

3. The heating body according to claim 1, wherein the area with high resistivity is an area on which a transistor is formed.

4. The heating body according to claim 1, wherein the first electrode and the second electrode are arranged in a same side area along an outer peripheral edge of the semiconductor substrate.

5. The heating body according to claim 2, wherein the first electrode and the second electrode are arranged in a same side area along an outer peripheral edge of the semiconductor substrate.

6. The heating body according to claim 1, wherein the diffusion resistance layer is formed of a layer obtained by allowing impurities to be doped on a surface of the semiconductor substrate.

7. The heating body according to claim 2, wherein the diffusion resistance layer is formed of a layer obtained by allowing impurities to be doped on a surface of the semiconductor substrate.

8. The heating body according to claim 1, wherein the diffusion resistance layer is formed of a layer obtained by allowing impurities to be doped on a surface of the semiconductor substrate and a conductive layer.

9. The heating body according to claim 2, wherein the diffusion resistance layer is formed of a layer obtained by allowing impurities to be doped on a surface of the semiconductor substrate and a conductive layer.

10. The heating body according to claim 1, further comprising:
    an insulator layer on the diffusion resistance layer,
    wherein a first pad that is electrically connected to the first electrode and a second pad that is electrically connected to the second electrode are formed on a surface of the insulation layer.

11. The heating body according to claim 2, further comprising:
    an insulator layer on the diffusion resistance layer,
    wherein a first pad that is electrically connected to the first electrode and a second pad that is electrically connected to the second electrode are formed on a surface of the insulation layer.

12. The heating body according to claim 10, wherein the first pad overlaps with the first electrode in a plan view, and
    the second pad overlaps with the second electrode in a plan view.

13. A vibration device comprising:
    the heating body according to claim 1; and
    a resonator element,
    wherein the resonator element is arranged on a surface of the heating body.

14. A vibration device comprising:
    the heating body according to claim 2; and
    a resonator element,
    wherein the resonator element is arranged on a surface of the heating body.

15. The vibration device according to claim 13,
    wherein the heating body includes a thermosensitive element formed on the semiconductor substrate, and
    the thermosensitive element overlaps with the resonator element in a plan view.

16. An electronic apparatus comprising the vibration device according to claim 13.

17. A moving object comprising the vibration device according to claim 13.

18. The heating body according to claim 1, wherein the diffusion resistance layer is formed so as to cover a majority of the substrate.

19. The heating body according to claim 1, wherein one of the first and second voltages is a ground voltage.

20. The heating body according to claim 1, wherein the area has a heating amount smaller than that of the diffusion resistance layer.

* * * * *